United States Patent
Nagase et al.

(10) Patent No.: US 6,904,555 B2
(45) Date of Patent: Jun. 7, 2005

(54) DECODING APPARATUS AND DECODING METHOD, AND DATA RECEIVING APPARATUS AND DATA RECEIVING METHOD

(75) Inventors: Taku Nagase, Tokyo (JP); Makoto Natori, Saitama (JP)

(73) Assignee: Sony Corporation, Tokyo (JP)

( * ) Notice: Subject to any disclaimer, the term of this patent is extended or adjusted under 35 U.S.C. 154(b) by 593 days.

(21) Appl. No.: 09/965,896

(22) Filed: Sep. 28, 2001

(65) Prior Publication Data

US 2002/0062468 A1 May 23, 2002

(30) Foreign Application Priority Data

Sep. 29, 2000 (JP) ........................................ 2000-301413

(51) Int. Cl.[7] ...................... H03M 13/29; H03M 13/45; H04L 1/16
(52) U.S. Cl. ....................... 714/751; 714/755; 714/780; 714/790
(58) Field of Search ................................ 714/758, 824, 714/751, 755, 780, 790

(56) References Cited

U.S. PATENT DOCUMENTS

| | | | | |
|---|---|---|---|---|
| 5,983,384 | A | | 11/1999 | Ross ........................... 714/755 |
| 6,182,261 | B1 | * | 1/2001 | Haller et al. ................. 714/758 |
| 6,233,709 | B1 | * | 5/2001 | Zhang et al. ................. 714/774 |
| 6,292,918 | B1 | * | 9/2001 | Sindhushayana et al. ... 714/755 |
| 6,308,294 | B1 | * | 10/2001 | Ghosh et al. ................. 714/751 |
| 6,510,536 | B1 | * | 1/2003 | Crozier et al. ............... 714/755 |
| 6,526,531 | B1 | * | 2/2003 | Wang .......................... 714/704 |
| 6,557,139 | B2 | * | 4/2003 | Bohnke ....................... 714/758 |
| 6,591,390 | B1 | * | 7/2003 | Yagyu ......................... 714/755 |
| 6,615,385 | B1 | * | 9/2003 | Kim et al. ................... 714/758 |
| 6,665,357 | B1 | * | 12/2003 | Somayazulu ................ 375/341 |
| 6,675,342 | B1 | * | 1/2004 | Yagyu ......................... 714/755 |
| 6,678,857 | B2 | * | 1/2004 | Sindhushayana et al. ... 714/755 |

FOREIGN PATENT DOCUMENTS

| | | |
|---|---|---|
| WO | WO 00 21236 | 4/2000 |

OTHER PUBLICATIONS

Hong et al., "VLSI Circuit Complexity and Decoding Performance Analysis for Low–Power RSC Turbo–Code and Iterative Block Decoders Design", MILCOM 98, Oct. 1998, pp. 708–712.*

Zhai et al., "New Error Detection Techniques and Stopping Criteria for Turbo Decoding", 2000 Canadian Conference on Electrical and Computer Engineering, Mar. 2000, pp. 58–62.*

Wu et al., "A Simple Stopping Criterion for Turbo Decoding", IEEE Communications Letters, vol. 4, No. 8, Aug. 2000, pp. 258–260.*

(Continued)

*Primary Examiner*—Stephen M. Baker
(74) *Attorney, Agent, or Firm*—Frommer Lawrence & Haug LLP; William S. Frommer; Darren M. Simon

(57) ABSTRACT

Removing adverse effects in case error detection using error detection codes cannot be performed correctly, and improving the data transmission efficiency. The turbo decoder 6 compares data which is decoded this time with data which is decoded previous time, both of which are decoded in repetitive decoding processing, to obtain discord number information indicative of the number of discordant sign bits, and sends the information to a terminal I/F unit 7 and a packet flow retransmission controlling unit 10. Even though it is determined that error detection result from a CRC recalculating unit 9 shows that there exists no bit error, in case the number of discordant sign bits is larger than a predetermined threshold value, it is determined that there is generated error. And, a packet flow retransmission controlling unit 10 sends a signal requesting retransmission of data. Furthermore, data amount to be retransmitted is varied in accordance with the number of discordant sign bits to improve the data transmission efficiency.

12 Claims, 7 Drawing Sheets

OTHER PUBLICATIONS

Buckley M E et al.: "A Neural Network for Predicting Decoder Error in Turbo Decoders" IEEE Communications Letters, IEEE Service Center, Piscataway, US, US, vol. 3, No. 5, May 1999, pp. 145–147, XP000830480 ISSN: 1089–7798.

Shao Y et al.: "Two Simple Stopping Criteria for Turbo Decoding" IEEE Transactions on Communications, IEEE Inc. New York, US, vol. 47, No. 8, Aug. 1999, pp. 1117–1120, XP000848102 ISSN: 0090–6778.

Coulton P et al: "Simple hybrid type II ARQ technique using soft output information" Electronics Letters, IEE Stevenage, GB, vol. 36, No. 20, Sep. 28, 2000, pp. 1716–1717, XP006015786 ISSN: 0013–5194.

Banerjee A et al.: "Performance of hybrid ARQ schemes using turbo trellis coded modulation for wireless channels" Proceedings of IEEE Conference vol. 3, Sep. 23, 2000, pp. 1025–1029, XP010532684 Chicago.

Zhipei Chi et al.: "High throughput, low energy FEC/ARQ technique for short frame turbo codes" Proceedings of 2000 IEEE International Conference on Acoustics, Speech and Signal Processing, vol. 5, Jun. 5, 2000, pp. 2653–2656, XP010506552 istanbul.

Wai–Chung Chan et al.: "An adaptive hybrid FEC/ARQ protocol using turbo codes" 1997 IEEE 6th. International Conference on Universal Personal Communications Record. Sandiego, Oct. 12–16, 1997, IEEE International Conference on Universal Personal Communications, New York, IEEE, US, vol. 2, Conf. 6, Oct. 12, 1997, pp. 541–545, XP010248767 ISBN: 0–7803–3777–8.

Chang Y: "Q–ary Turbo Codes with QAM Modulations" International Conference on Universal Personal Communications, IEEE, New York, NY, US, vol. 2, Sep. 29, 1996, pp. 814–817, XP002135988.

Rowitch D N et al.: "On the Performance of Hybrid FEC/ARQ Systems Using Rate Compatible Punctured Turbo (RCPT) Codes" IEEE Transactions on Communications, IEEE Inc. New York, US, vol. 48, No. 6, Jun. 2000, pp. 948–959, XP000954425 ISSN: 0090–6778.

* cited by examiner

DECODING APPARATUS AND DECODING METHOD, AND DATA RECEIVING APPARATUS AND DATA RECEIVING METHOD

BACKGROUND OF THE INVENTION

1. Field of the Invention

The present invention relates to a decoding apparatus and a decoding method for decoding turbo-coded data, and a data receiving apparatus and a data receiving method for employing the turbo decoding.

2. Description of Related Art

Recently, there is proposed an encoding method employing Turbo Codes as error correcting codes which can substantially realize the Shannon limit. The turbo codes have been studied and improved as codes with high performance and high reliability for use in various fields including mobile communication and digital broadcasting. The turbo codes are referred to also as Parallel Concatenated Convolution Codes (PCCC).

A turbo encoder is configured by concatenating a plurality of encoders in parallel. Specifically, for example, two convolutional encoders and an interleaver are concatenated in parallel. In decoding turbo-coded data, a plurality of decoders are used, and decoding processing is performed repeatedly using the reliability of resulting decoded data. Thus, exchanging information therebetween, the decoders can obtain ultimate decoded data. In performing the decoding processing, the soft decision decoding such as the MAP (Maximum a-posteriori Probability) algorithm.

Next, a turbo encoder for performing turbo encoding and a turbo decoder for performing turbo decoding will be explained hereinafter with reference to drawings.

FIG. 1 shows a block diagram of the turbo encoder for performing above-described turbo encoding. As shown, input data from an input terminal 101 is sent to a parallel-to-serial converter 102, and to a convolutional encoder 103. The input data is sent also to a convolutional encoder 105 via an interleaver 104.

The convolutional encoder 103 performs convolutional computing for the input data, and sends the resulting data to the parallel-to-serial converter 102 as parity bit Da. The convolutional encoder 103 consists of, for example, an adder 111, two delay elements such as D flip-flops (DFFs) 112, 113, and an adder 114. The interleaver 104 changes the order of bits constituting the input data to rearrange the bits, and sends the resulting interleaved data to the convolutional encoder 105. The convolutional encoder 105, which has the same configuration as that of the convolutional encoder 103, performs convolutional computing for the interleaved input data, and sends the resulting data to the parallel-to-serial converter 102 as parity bit Db. The encoding processing is performed every block consisting of bits of a predetermined number, which becomes the unit of the encoding processing, and this block is referred to also as a code block.

The parallel-to-serial converter 102 converts systematic bit Ds, which is the original input data from the input terminal 101, the parity bit Da from the convolutional encoder 103, the parity bit Db from the convolutional encoder 105 to serial data, and outputs the resulting data from an output terminal 106. The output data undergoes predetermined modulating processing for communication to be transmitted.

FIG. 2 shows a block diagram of the turbo decoder which corresponds to above-described turbo encoder. An input terminal 121 receives a signal, which is encoded by above-described turbo encoder, and is modulated to be transmitted, and then is received by the turbo decoder and demodulated. The received signal is sent to a normalizing circuit 122 adapted for adjusting the signal level of a signal sent thereto appropriately, and then is sent to a serial-to-parallel converter 123.

The serial-to-parallel converter 123, which corresponds to the parallel-to-serial converter 102 shown in FIG. 1, divides the received signal into the systematic bit Ds, parity bit Da, and parity bit Db. The separated systematic bit Ds is sent to a soft output decoding unit 124 and to an interleaver 125. The separated parity bit Da is sent to the soft output decoding unit 124. The separated parity bit Db is sent to the soft output decoding unit 126. An output from the soft output decoding unit 124 is sent to the soft output decoding unit 126 via an interleaver 127, and an output from the soft output decoding unit 126 is fed-back to the soft output decoding unit 124 via a deinterleaver 128. And, this decoding processing is to be performed repeatedly by the code block unit, that is, repetitively decoding (turbo decoding) processing is to be performed. Ultimate decoded data from the soft output decoding unit 126 is converted to binary data by a hard deciding circuit 129, and is deinterleaved by a deinterleaver 130, and the resulting data is sent to an output terminal 131 to be sent therefrom.

The soft output decoding unit 124 consists of a MAP (Maximum a-posteriori Probability) algorithm circuit 134 and an adder 135. The MAP algorithm circuit 134 receives the systematic bit Ds and parity bit Da from the serial-to-parallel converter 123, and an output from the deinterleaver 128. An output from the MAP algorithm circuit 134 is sent to the adder 135. The adder 135 subtracts the systematic bit Ds and output of the deinterleaver 128 from the output of the MAP algorithm circuit 134. An output from the adder 135 is sent to the interleaver 127.

The soft output decoding unit 126 consists of a MAP algorithm circuit 136 and an adder 137. The MAP algorithm circuit 136 receives an output from the interleaver 125, the parity bit Db from the serial-to-parallel converter 123, and an output from the interleaver 127. An output from the MAP algorithm circuit 136 is sent to a hard deciding circuit 129 and the adder 137. The adder 137 subtracts the output of the interleaver 125 and output of the interleaver 127 from the output of the MAP algorithm circuit 136. An output from the adder 137 is sent to the deinterleaver 128.

A timing controlling circuit 133 controls the operation timing of the serial-to-parallel converter 123, MAP algorithm circuits 134 and 136, interleavers 125 and 127, and deinterleavers 128 and 130 of the turbo decoder, respectively.

In the turbo decoder shown in FIG. 2, the decoding processing is to be repeated several times or scores of times. Before performing the repetitive decoding processing, the interleaver 125 stores the systematic bit Ds of the input signal in advance. Also, the deinterleaver 128 is caused to be initialized with an initial value (zero) in advance.

Next, one of the repetitive decoding processing of the turbo decoding will be explained briefly. Firstly, at the first half of the processing, the MAP algorithm of the MAP algorithm circuit 134 is operated. In performing the processing of the MAP algorithm, the systematic bit Ds, parity bit Da, and output from the deinterleaver 128 are used. An output generated by performing the processing of the MAP algorithm is sent to the interleaver 127 via the adder 135, and is stored in the interleaver 127. At the first time of the repetitive decoding processing, since the interleaver 127 has stored therein no information, the initial value (zero) is used. At the latter half of the processing, the MAP algorithm of the MAP algorithm circuit 136 is operated. In performing the processing of the MAP algorithm, interleaved systematic bit Ds from the interleaver 125, the parity bit Db from the serial-to-parallel converter 123, and the output from the interleaver 127 are used. An output generated by performing the processing of the MAP algorithm is sent to the deinterleaver 128 via the adder 137, and is stored in the deinterleaver 128. The output generated by performing the processing of the MAP algorithm is hard-decided by the hard deciding circuit 129, and the resulting output (sign bits) is sent to the deinterleaver 130 to be stored therein.

This is the brief explanation of one of the repetitive decoding processing of the turbo decoding. After performing this processing several times which is determined in advance, the finally decoded data stored in the deinterleaver 130 which is obtained by performing the processing of the MAP algorithm of the MAP algorithm circuit 136 is sent to the output terminal 131 to be output therefrom as ultimate decoded data.

Next, one example of a data transmitting/receiving apparatus employing above-described turbo encoding technique and turbo decoding technique will be explained with reference to FIG. 3.

FIG. 3 shows a block diagram of the data transmitting/receiving apparatus. A signal received by an antenna 1 is sent to a low noise amplifier 3 via a shared device 2 for, sharing the antenna 1 at the time of transmitting/receiving a signal. The received signal is amplified by the low noise amplifier 3, and is converted to a baseband signal by a reception RF (Radio Frequency) unit 4, and then is demodulated by a demodulating unit 5 by undergoing baseband signal processing. The demodulated signal is turbo-decoded by a turbo decoder 6 corresponding to the turbo decoder in FIG. 2, and is sent to a terminal interface (I/F) unit 7. The terminal I/F unit 7 sends the received packet data to a data terminal 8. The resulting decoded data from the turbo decoder 6 is sent to a CRC (Cyclic Redundancy Check) recalculating unit 9 to undergo the CRC recalculation. Then, it is judged whether or not check bits included in the decoded data accord with the calculated result, that is whether or not error is generated, and the judgement result is sent to the terminal I/F unit 7 and to a packet flow retransmission controlling unit 10.

Data to be transmitted from the data terminal 8 is sent to a turbo encoding and frame forming unit 11 via the terminal I/F unit 7 and packet flow retransmission controlling unit 10 to undergo the turbo encoding processing described with reference to FIG. 1 and frame forming processing. The encoded data from the turbo encoding and frame forming unit 11 is modulated by a modulating unit 12, and is converted to an RF signal by a transmission RF unit 13, and is amplified by a power amplifier 14, and then is sent to the antenna 1 via the shared device 2.

In case it is determined that the error detection result from the CRC recalculating unit 9 shows that there exists no bit error, the terminal I/F unit 7 discards the received packet data, and the packet flow retransmission controlling unit 10 sends a signal requesting retransmission of packet data to the turbo encoding and frame forming unit 11 of the transmitting unit.

Above-described conventional data transmitting/receiving apparatus performs the error detection by the use of error detecting codes. On the other hand, there remains a possibility that the error detection using the error detection codes cannot be performed correctly under a certain probability. In this case, there occurs a problem that incorrect packet data is undesirably sent to the data terminal 8. Also, in case there exist incorrect bits, even though one bit, all the packet is to be retransmitted, which lowers the data transmission efficiency.

SUMMARY OF THE INVENTION

It is therefore an object of the present invention to overcome the above-mentioned drawbacks by providing a decoding apparatus and a decoding method, and a data receiving apparatus and a data receiving method, which can remove adverse effects in case the error detection using the error detection codes cannot be performed correctly, and can vary data amount to be retransmitted in accordance with the degree of error in case packet data is required to be retransmitted, thereby improving the data transmission efficiency.

According to the present invention, there is provided a decoding method for decoding parallel concatenated coded data, in performing decoding processing repeatedly using soft output decoding means of a plurality of stages, the decoding method including the steps of:

comparing data which is decoded this time with data which is decoded previous time, both of which are decoded in the repetitive decoding processing;

detecting error of resulting decoded data using error detecting codes; and finally judging whether or not error is generated in accordance with error detecting output data obtained at the error-detecting step and comparing output data obtained at the comparing step.

The comparing step obtains the number of discordant sign bits by comparing sign bits of this time with sign bits of previous time, where the sign bits are included in output data from the last stage of the soft output decoding means of the plural stages. And, in case the number of discordant sign bits is larger than a predetermined value, the judging step determines that there is generated error even though the error detection result shows that there is generated no error.

According to the present invention, there is also provided a data receiving method which has function of receiving parallel concatenated coded data and decoding the data repeatedly by using soft output decoding means of a plurality of stages, including the steps of:

comparing data which is decoded this time with data which is decoded previous time, both of which are decoded in the repetitive decoding processing;

detecting error of resulting decoded data using error detecting codes; and retransmission controlling step of sending a signal requesting retransmission of data in accordance with comparing output data obtained at the comparing step and error detecting output data obtained at the error-detecting step.

The comparing step compares sign bits of this time with sign bits of previous time, where the sign bits are included in output data from the last stage of the soft output decoding means of the plural stages. And, the retransmission controlling step sends the signal requesting retransmission of data in case the error-detecting step determines that there is generated error, and changes the retransmitting manner in accordance with the number of discordant sign bits obtained at the comparing step. In this case, in case the number of discordant sign bits is larger than a predetermined value, it is determined that there is generated error irrespective of the error detection result, and the retransmission controlling step sends the signal requesting retransmission of data.

In case the received coded data is punctured codes which has a portion of data thereof deleted at an encoding side, the retransmission controlling step sends the signal requesting retransmission of data by selecting one of retransmission of the deleted data, retransmission of original punctured codes, and retransmission of all data before being deleted, in accordance with the number of discordant sign bits obtained at the comparing step. In this case, in case the number of discordant sign bits is small, retransmission of the deleted data is effective. On the other hand, in case the number of discordant sign bits is large, retransmission of previously transmitted data, that is, original punctured codes, or retransmission of all data before being deleted is effective. In case only data which is deleted is required to be retransmitted, the data which is deleted at the puncturing processing and the previously transmitted packet data (punctured codes) are combined, and the combined data as data which is not punctured is decoded, thereby improving error correction ability. Thus, generation of error can be suppressed. Generally, the number of bits which are deleted by the puncturing processing is from several % to 20% of all the error-correcting-coded packet data, which is smaller than that of bits of all the packet data. Thus, the efficiency of data transmission can be improved.

These objects and other objects, features and advantages of the present invention will become more apparent from the following detailed description of the preferred embodiments of the present invention when taken in conjunction with the accompanying drawings.

DESCRIPTION OF THE PREFERRED EMBODIMENTS

Preferred embodiments according to the present invention will further be described below with reference to the accompanying drawings.

Figure 4:
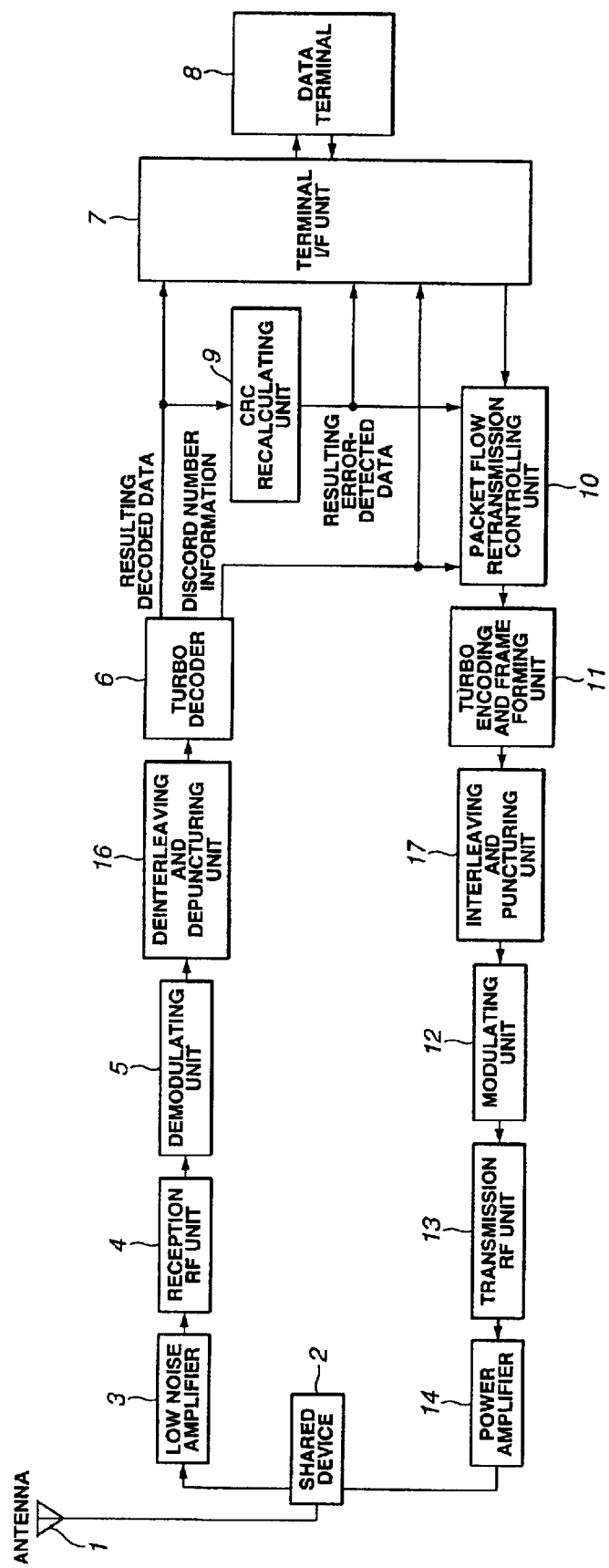
FIG. 4 shows a block diagram of a data transmitting/receiving apparatus according to the present invention.

FIG. 4 shows a block diagram of the data transmitting/receiving apparatus employing the data receiving apparatus and data receiving method according to the present invention. A signal received by an antenna 1 is sent to a low noise amplifier 3 via a shared device 2 for sharing the antenna 1 at the time of transmitting/receiving a signal. The received signal is amplified by the low noise amplifier 3, and is converted to a baseband signal by a reception RF (Radio Frequency) unit 4, and then is demodulated by a demodulating unit 5 by undergoing baseband signal processing. The demodulated signal is sent to a deinterleaving and depuncturing unit 16, where the order of bits constituting data interleaved at an interleaving side is returned to original order, and punctured bits are interpolated with zero data.

The puncturing is a technique to delete a portion of error-correcting-coded data and not to send the deleted data. A code obtained by undergoing the puncturing is referred to as a punctured code. This punctured code is used to adjust the number of bits which is caused to be increased due to the error correction using the error correcting codes so that to the number of bits becomes the desired number.

Figure 5:
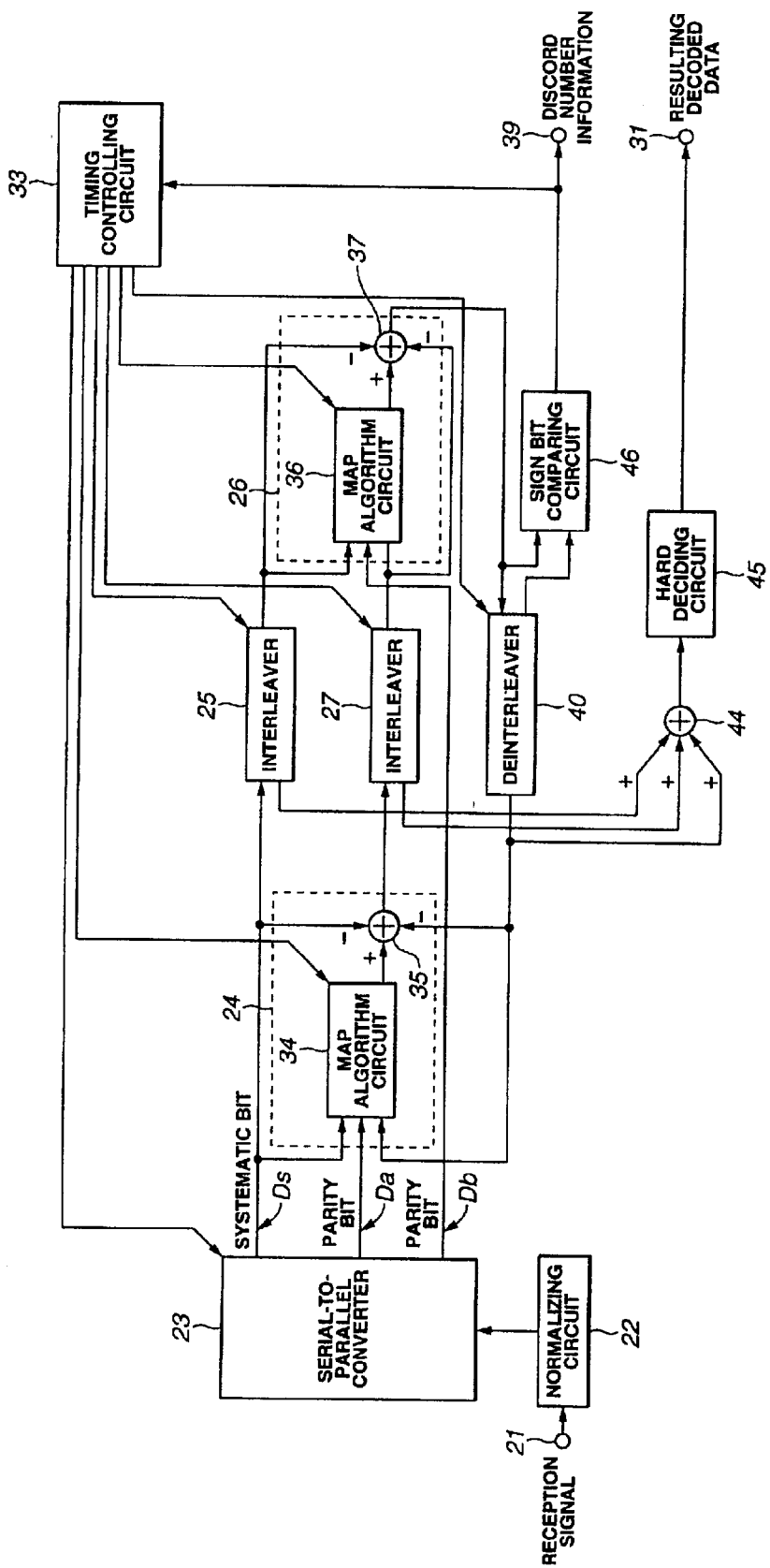
FIG. 5 shows a block diagram of a turbo decoder which is employed in the data transmitting/receiving apparatus according to the present invention.

The signal deinterleaved and depunctured by the deinterleaving and depuncturing unit 16 is turbo-decoded by a turbo decoder 6 corresponding to a turbo decoder, to be shown in FIG. 5, and is sent to a terminal interface (I/F) unit 7 and to a CRC (Cyclic Redundancy Check) recalculating unit 9. The terminal I/F unit 7 sends the received packet data to a data terminal 8. The CRC (Cyclic Redundancy Check) recalculating unit 9 performs error detection by the use of the CRC codes being error detecting codes included in the packet data, and judges whether or not error is generated in bits. The result of the error correction using the CRC is sent to the terminal I/F unit 7 and also to the packet flow retransmission controlling unit 10.

Data to be transmitted from the data terminal 8 is sent to a turbo encoding and frame forming unit 11 via the terminal I/F unit 7 and packet flow retransmission controlling unit 10 to undergo the turbo encoding processing described with reference to FIG. 1 and frame forming processing. The encoded data from the turbo encoding and frame forming unit 11 is sent to an interleaving and puncturing unit 17 to undergo interleaving processing for changing the order of data bits and deleting a portion of data, and is then sent to the modulating unit 12. The signal modulated by the modulating unit 12 is converted to an RF signal by a transmission RF unit 13, and is amplified by a power amplifier 14, and then is sent to the antenna 1 via the shared device 2.

In the embodiment, the turbo decoder 6 sends discord number information along with the decoded data. The discord number information, which is to be described later, shows a comparison result obtained by comparing data which is decoded this time with data which is decoded previous time, both of which are decoded in the repetitive decoding processing by the turbo decoder 6, and is sent to the terminal I/F unit 7 and also to the packet flow retransmission controlling unit 10. It may be determined by the discord number information that there exists error, even though the result of the error detection performed by the CRC recalculating unit 9 shows that there exists no error. That is, the terminal I/F unit 7 and packet flow retransmission controlling unit 10 modifies the result of the error detection of the CRC recalculating unit 9 and judges existence of error in accordance with the discord number information from the turbo decoder 6.

FIG. 5 shows a block diagram of the turbo decoder 6 of the data transmitting/receiving apparatus shown in FIG. 4. Since the turbo encoding processing is block encoding processing, the encoding and decoding processing is performed every block consisting of bits of a predetermined number, which becomes the unit of the encoding and decoding processing, and this block is referred to also as a code block. Each magnitude of the interleaved data and deinterleaved data is generally equals to the number of bits of one block. The packet size of packet data for data communication can be set up independently of the size of the code block. On the other hand, for the convenience of explanation, in the embodiment, the packet size of packet data is equal to the size of the code block, and the error detecting code bit generated by the CRC is added for each packet.

Figure 2:
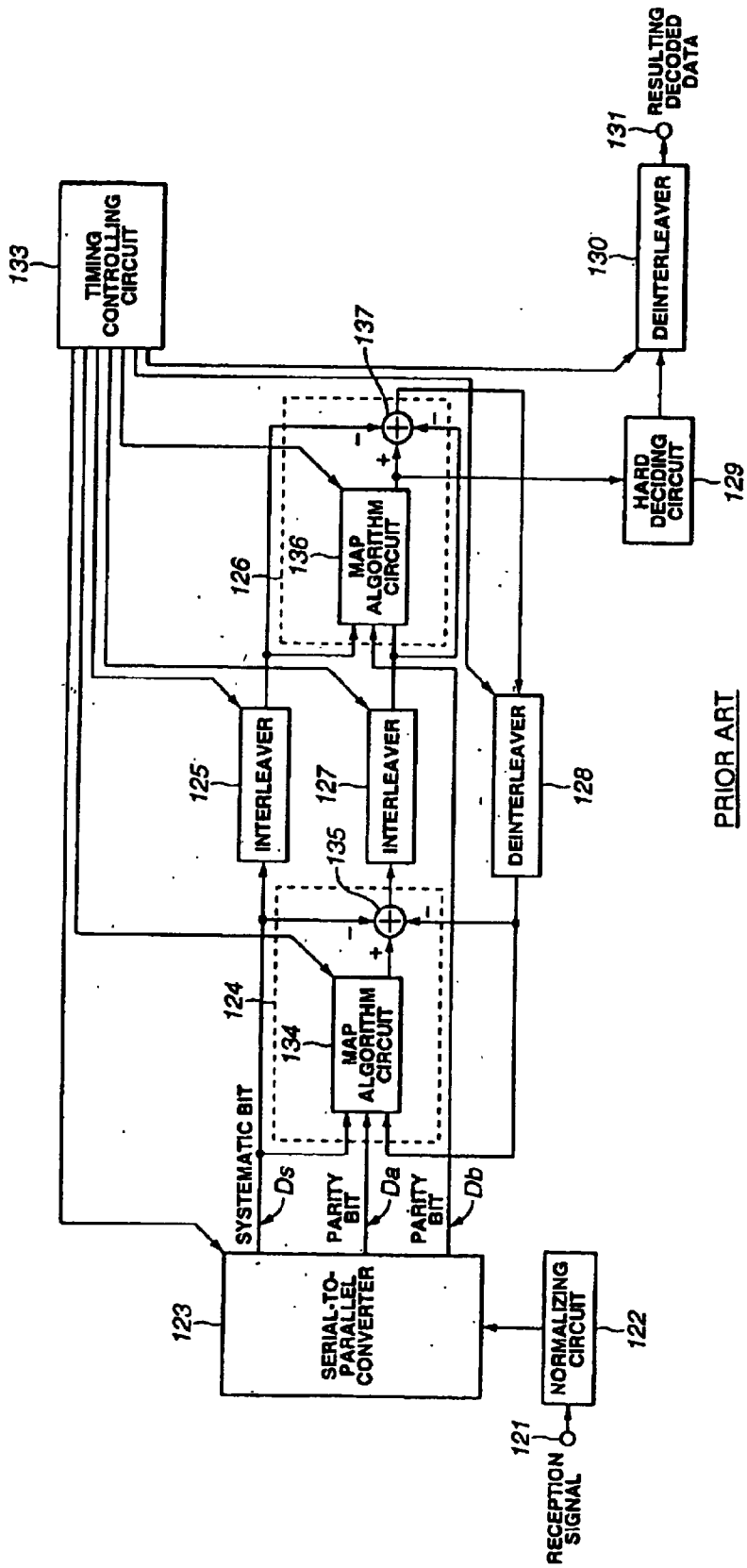
FIG. 2 shows a block diagram of a turbo decoder.
Figure 3:
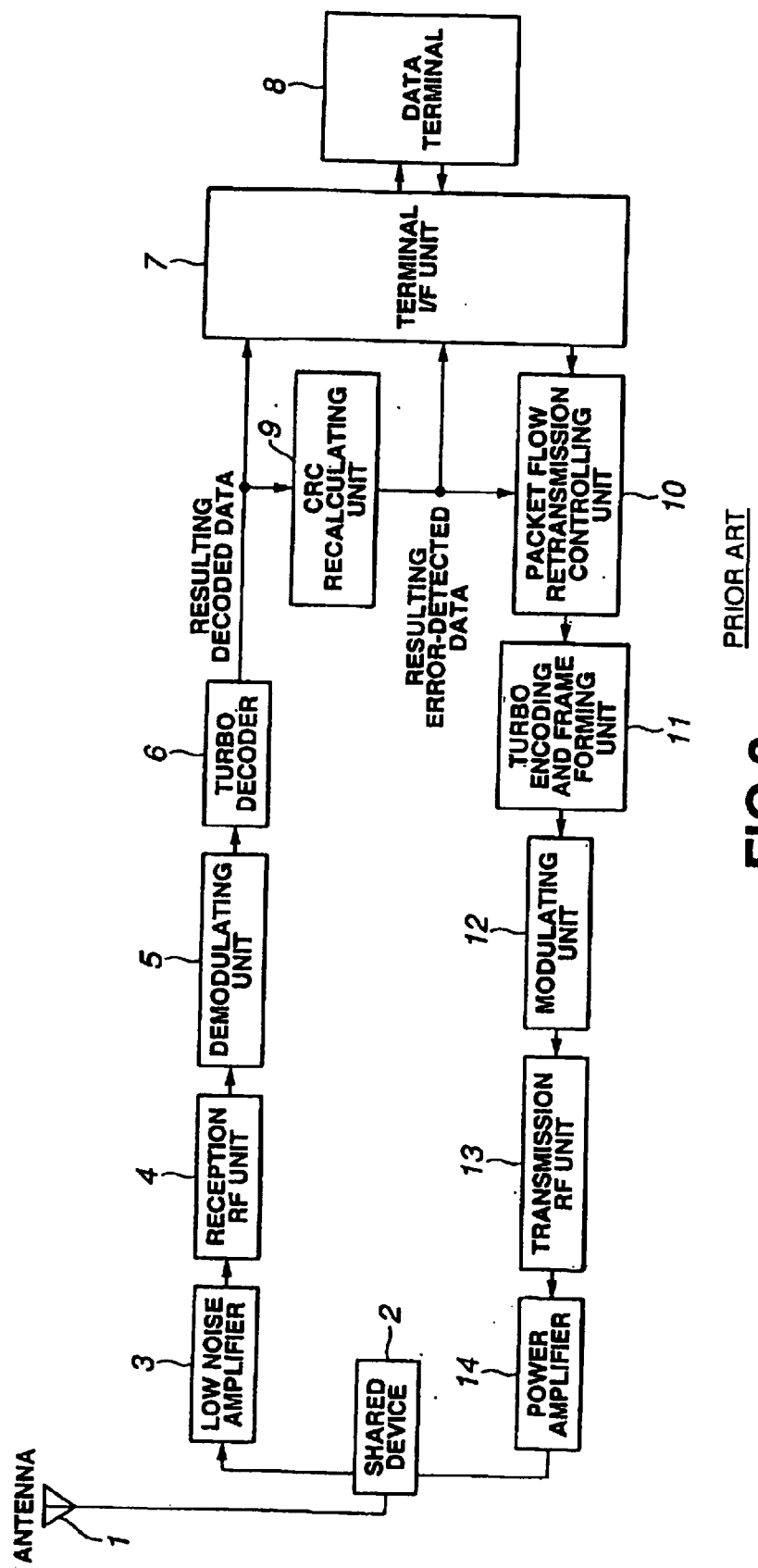
FIG. 3 shows a block diagram of a data transmitting/receiving apparatus employing a turbo encoding unit and a turbo decoding unit.

In the turbo decoder shown in FIG. 5, similar to the turbo decoder shown in FIG. 2, the decoding processing is to be repeated several times or scores of times by a soft output decoding unit of a plurality of stages for performing decoding processing repeatedly. On the other hand, in the configuration shown in FIG. 5, data which is decoded this time is compared with data which is decoded previous time, both of which are decoded in the repetitive decoding processing by the soft output decoding unit, and repeating operation of the repetitive decoding processing is to be suspended in accordance with the comparison result. The turbo decoder 6 shown in FIG. 6 includes a deinterleaver 40 which has the function of deinterleaver 128 and that of deinterleaver 130 shown in FIG. 2. An output from an adder 37 of the soft output decoding unit 26 is sent to the deinterleaver 40, and an output from the deinterleaver 40 is returned to a MAP algorithm circuit 34 of an soft output decoding unit 24 in the inputting stage, and this processing is repeated. At the final processing, the output from the deinterleaver 40 is sent to an adder 44, where an output from an interleaver 25 and an output from an interleaver 27 are added to the output from the deinterleaver 40. Thus, operation of the adder 37 of the soft output decoding unit 26 is offset, that is operation of subtracting the outputs of the interleaver 25 and interleaver 27 from an output of a MAP algorithm circuit 36 is offset, thereby an effect equal to that in FIG. 2 can be obtained.

Figure 1:
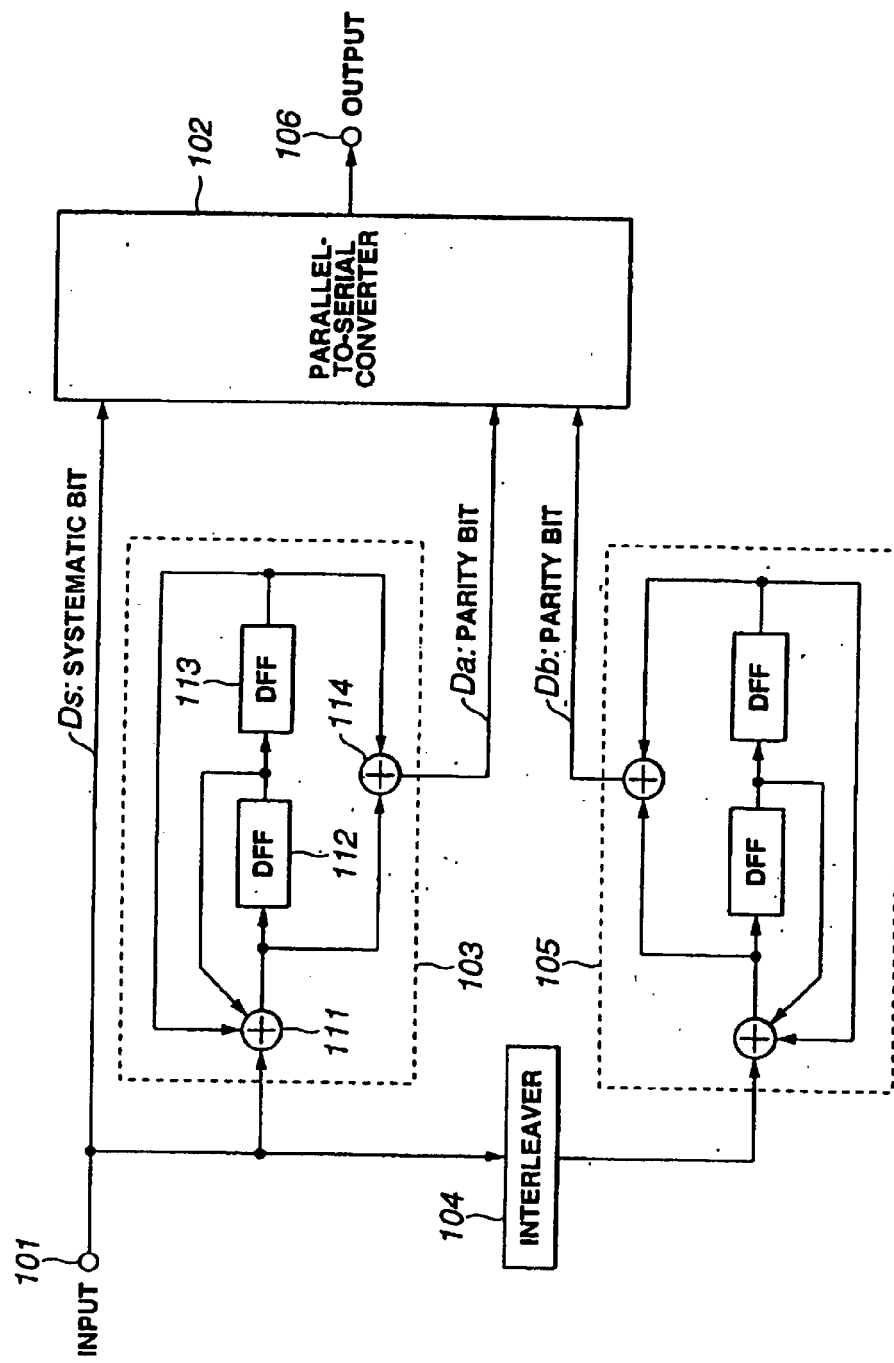
FIG. 1 shows a block diagram of a turbo encoder.

In FIG. 5, an input terminal 21 receives a signal which is encoded by the turbo encoder shown in FIG. 1. Actually, the signal is encoded by the turbo encoder at the transmission side, and is modulated to be transmitted, and then is received by the turbo decoder and demodulated. The received signal is sent to a normalizing circuit 22 adapted for adjusting the signal level of a signal sent thereto appropriately, and then is sent to a serial-to-parallel converter 23.

The serial-to-parallel converter 23, which corresponds to the parallel-to-serial converter 102 shown in FIG. 1, divides the received signal into the systematic bit Ds, parity bit Da, and parity bit Db. The separated systematic bit Ds is sent to a soft output decoding unit 24 and to an interleaver 25. The separated parity bit Da is sent to the soft output decoding unit 24. The separated parity bit Db is sent to the soft output decoding unit 26. An output from the soft output decoding unit 24 is sent to the soft output decoding unit 26 via an interleaver 27, and an output from the soft output decoding unit 26 is fed-back to the soft output decoding unit 24 via a deinterleaver 40. And, this decoding processing is to be performed repeatedly by the code block unit, that is, repetitively decoding (turbo decoding) processing is to be performed.

A timing controlling circuit 33 controls the operation timing of the serial-to-parallel converter 23, MAP algorithm circuits 34 and 36, interleavers 25 and 27, and deinterleaver 40 of the turbo decoder, respectively.

Sign bits of one code block of the output from the soft output decoding unit 26 and sign bits of one code block of the output from the soft output decoding unit 26 stored in the deinterleaver 40 which is obtained by the previous processing of the repetitive decoding processing are sent to a sign bit comparing circuit 46 to be compared with each other. And the comparison result is sent to the timing controlling circuit 33 and to an output terminal 39. In case all the sign bits of respective one code blocks are equal to each other, the timing controlling circuit 33 suspends the repeating operation of the repetitive decoding processing to obtain resulting decoded data. This operation is performed by employing the feature that the decoder becomes stable in case the decoding processing is performed correctly. In case all the sign bits of respective one code blocks are not equal to each other, the repeating operation of the repetitive decoding processing is performed predetermined prescribed times to obtain resulting decoded data.

Ultimate decoded data from the soft output decoding unit 26 is sent to a hard deciding circuit 45 via the deinterleaver 40 and adder 44, and is converted to binary data by the soft output decoding unit 26, and then the resulting data is sent to the output terminal 31 to be sent therefrom. In outputting the resulting decoded data, information indicative of the number of discordant sign bits (discord number information) from the sign bit comparing circuit 46 is output from the output terminal 39. As described above, in case all the sign bits of respective one code blocks, one of which is of this time and the other of which is of the previous time, are equal to each other and the repeating operation of the repetitive decoding processing is suspended, the number of discordant sign bits becomes zero.

The soft output decoding unit 24 consists of the MAP (Maximum a-posteriori Probability) algorithm circuit 34 and an adder 35. The MAP algorithm circuit 34 receives the systematic bit Ds and parity bit Da from the serial-to-parallel converter 23, and an output from the deinterleaver 40. An output from the MAP algorithm circuit 34 is sent to the adder 35. The adder 35 subtracts the systematic bit Ds and output of the deinterleaver 40 from the output of the MAP algorithm circuit 34. An output from the adder 35 is sent to the interleaver 27.

The soft output decoding unit 26 consists of the MAP algorithm circuit 36 and adder 37. The MAP algorithm circuit 36 receives the output from the interleaver 25, the parity bit Db from the serial-to-parallel converter 23, and the output from the interleaver 27. The output from the MAP algorithm circuit 36 is sent to a hard deciding circuit 29 and the adder 37. The adder 37 subtracts the output of the interleaver 25 and output of the interleaver 27 from the output of the MAP algorithm circuit 36. The output from the adder 37 is sent to the deinterleaver 28.

In the turbo decoder shown in FIG. 5, the adder 44 for offsetting the operation of the adder 37 of the soft output decoding unit 26 is arranged at a portion where the resulting decoded data is obtained. Thus, decoding effect equal to that of the turbo decoder shown in FIG. 2 can be realized without using the deinterleaver 130 shown in FIG. 2 for obtaining the ultimate decoded data. That is, in obtaining the ultimate decoded data, the adder 44 adds the outputs from the interleaver 25 and interleaver 27 to the output from the deinterleaver 40, thereby obtaining an output which is equal to the ultimate decoded data from the MAP algorithm circuit 36 of the soft output decoding unit 26. Then the adder 44 sends the ultimate decoded data to the hard deciding circuit 45.

Also, in the turbo decoder shown in FIG. 5, since the sign bits of this time and the sign bits of the previous time, both of which are obtained in the repetitive decoding processing and stored in the internal deinterleaver, are compared with each other, and the repeating operation of the repetitive decoding processing is suspended in case all the sign bits are equal to each other. Thus, when there is generated little error and all the error is corrected during the repeating operation, the repeating operation of the repetitive decoding processing is not performed predetermined prescribed times. So, the problem of wasting power can be avoided. Also, even though error detecting codes such as CRC are not added to the code blocks, the state in which error does not exist can be detected. Furthermore, a deinterleaver dedicated for only the resulting decoded data (deinterleaver 130 in FIG. 2) is not required, and the internal deinterleaver (deinterleaver 40 in FIG. 5) is used also for outputting the ultimate decoded data, which can suppress the hardware magnitude of the turbo decoder.

Next, turbo decoding to be performed by the turbo decoder shown in FIG. 5 will be explained. Before starting the repeating operation of the repetitive decoding processing, the interleaver 25 stores in advance the systematic bit Ds of the input signal therein. The deinterleaver 40 is also initialized in advance with an initial value (zero).

Next, one of the repetitive decoding processing of the turbo decoding will be explained briefly. Firstly, at the first half of the processing, the MAP algorithm of the MAP algorithm circuit 34 is operated. In performing the processing of the MAP algorithm, the systematic bit Ds, parity bit Da, and output from the deinterleaver 40 are used. An output generated by performing the processing of the MAP algorithm is sent to the interleaver 27 via the adder 35, and is stored in the interleaver 27. At the first time of the repetitive decoding processing, since the interleaver 27 has stored therein no information, the initial value (zero) is used. At the latter half of the processing, the MAP algorithm of the MAP algorithm circuit 36 is operated. In performing the processing of the MAP algorithm, interleaved systematic bit Ds from the interleaver 25, the parity bit Db from the serial-to-parallel converter 23, and the output from the interleaver 27 are used. An output generated by performing the processing of the MAP algorithm is sent to the deinterleaver 40 via the adder 37, and is stored in the deinterleaver 40.

Furthermore, in storing information indicative of the resulting decoded data from the soft output decoding unit 26 in the deinterleaver 40 which used in the repetitive decoding processing, the sign bit comparing circuit 46 compares the sign bits of the information indicative of the resulting decoded data with sign bits of information which is obtained by the previous repetitive decoding processing and stored in the deinterleaver 40. In case all the sign bits of respective one code blocks are equal to each other, the sign bit comparing circuit 46 sends a signal indicative of the result to the timing controlling circuit 33, and the timing controlling circuit 33 suspends the repeating operation of the repetitive decoding processing. Then, the output from the deinterleaver 40 is sent to the hard deciding circuit 45 via the adder 44, and an output (sign bits) which is hard-decided by the hard deciding circuit 45 is output from the output terminal 31 as the resulting decoded data.

As described above, in case all the sign bits of respective one code blocks are not equal to each other, the repeating operation of the repetitive decoding processing is performed predetermined prescribed times to obtain resulting decoded data. In outputting the resulting decoded data, information indicative of the number of discordant sign bits (discord number information) from the sign bit comparing circuit 46 is output from the output terminal 39.

The resulting decoded data from the output terminal 31 is sent to the terminal I/F unit 7 and to the CRC recalculating unit 9 shown in FIG. 4. The discord number information from the output terminal 39 is sent to the terminal I/F unit 7 and to the packet flow retransmission controlling unit 10 shown in FIG. 4.

In the terminal I/F unit 7 shown in FIG. 4, in case it is determined that the error detection result from the CRC recalculating unit 9 shows that there exists no bit error, the number of discordant sign bits n in the discord number information from the turbo decoder 6 is compared with a predetermined threshold value Th. In case the number of discordant sign bits n is equal to or less than the threshold value Th ($n \leq Th$), it is determined that there is no error in the packet data. And, the terminal I/F unit 7 sends received packet data to the data terminal 8, and the packet flow retransmission controlling unit 10 sends a signal indicating that the packet data is correctly received to the turbo encoding and frame forming unit 11 at the transmission side. Then, the signal is sent to the antenna 1 via the interleaving and puncturing unit 17, modulating unit 12, transmission RF unit 13, power amplifier 14, and shared device 2. And the antenna 1 transmits the signal to a transmitting device, not shown. Then, the transmitting device starts transmission of the next packet data.

On the other hand, in case it is determined that the error detection result from the CRC recalculating unit 9 shows that there exists bit error, the terminal I/F unit 7 discards the received packet data, and the packet flow retransmission controlling unit 10 sends a signal requesting retransmission of packet data to the turbo encoding and frame forming unit 11 at the transmission side. Then, the signal requesting retransmission is sent to the antenna 1 via the interleaving and puncturing unit 17, modulating unit 12, transmission RF unit 13, power amplifier 14, and shared device 2. And the antenna 1 transmits the signal to a transmitting device, not shown. Then, the transmitting device retransmits the packet data.

In the embodiment, even though it is determined that the error detection result from the CRC recalculating unit 9 shows that there exists no bit error, in case the number of discordant sign bits n in the discord number information from the turbo decoder 6 is larger than the threshold value Th ($n>Th$), it is determined that there is generated error in the packet data. In this case also, the terminal I/F unit 7 discards the received packet data, and the packet flow retransmission controlling unit 10 sends a signal requesting retransmission of packet data to the turbo encoding and frame forming unit 11.

Even though it is determined that the error detection result from the CRC recalculating unit 9 shows that there exists no bit error, since there is generated error under a certain probability when performing the CRC error detection, if the judgement is performed by using only the result of the CRC error detection, incorrect packet data is undesirably sent to the data terminal 8. On the other hand, with above-described embodiment, the number of discordant sign bits n, which is the number of different sign bits between the sign bits of this time and the sign bits of the previous time both of which are obtained in the repetitive decoding processing, is compared with the predetermined threshold value Th. Thus, misjudgment of the error detection by the CRC can be prevented, and sending incorrect packet data to the data terminal 8 can be avoided.

In case it is judged whether or not error exists in the decoded data, including the discord number information, and it is determined that there exists error, the data retransmitting method for the data retransmitting request is desired to be changed in accordance with the number of discordant sign bits in the discord number information. Next, an embodiment in which the data retransmitting method is changed in accordance with the discord number information is explained with reference to FIG. 6.

Figure 6:
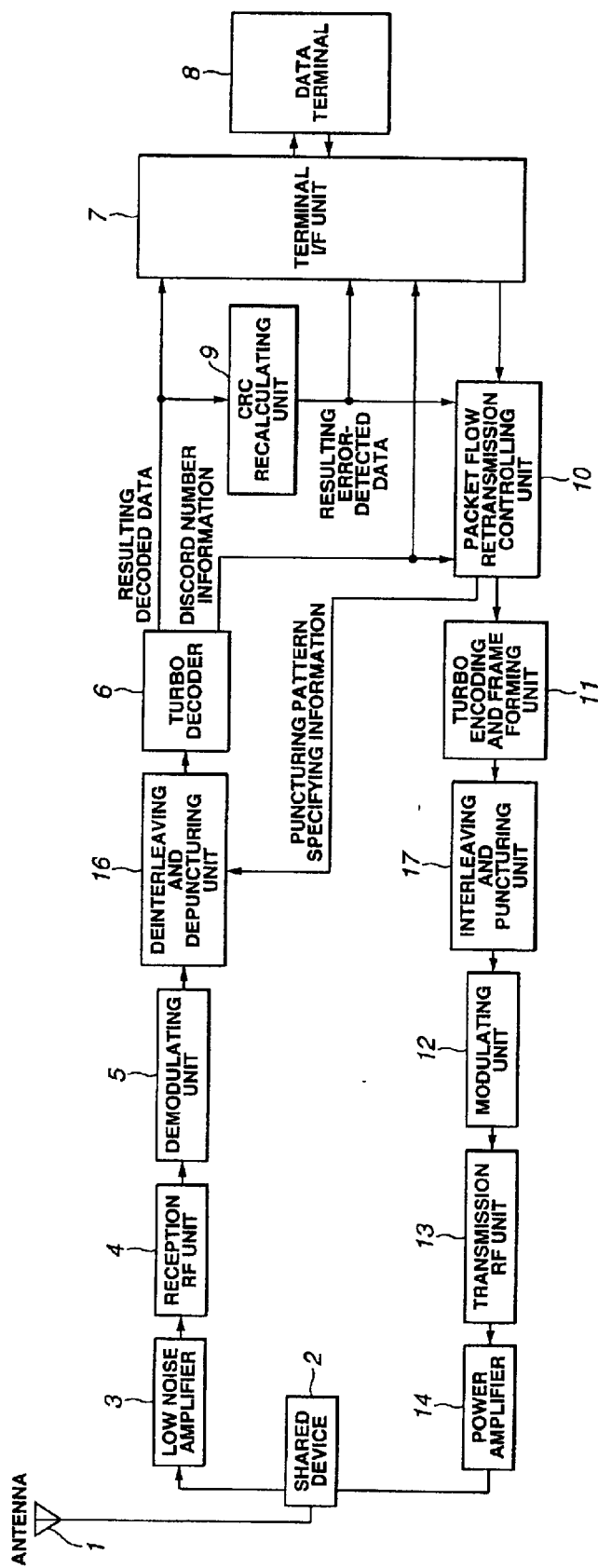
FIG. 6 shows another example of a block diagram of a data transmitting/receiving apparatus according to the present invention.

FIG. 6 shows a block diagram of another example of the data transmitting/receiving apparatus according to the present invention, in which the data retransmitting method is changed in accordance with the discord number information. In FIG. 6, the parts or components similar to those of the data transmitting/receiving apparatus shown in FIG. 4 are indicated with the same reference numerals, and the detailed explanation will be omitted. The fundamental operation of the data transmitting/receiving apparatus shown in FIG. 6 is similar to that of the data transmitting/receiving apparatus shown in FIG. 4, while the operation of the terminal I/F unit 7, packet flow retransmission controlling unit 10, and deinterleaving and depuncturing unit 16 are different therefrom.

That is, even though it is determined that the error detection result from the CRC recalculating unit 9 shows that there exists no bit error, in case the number of discordant sign bits n in the discord number information from the turbo decoder 6 is larger than the threshold value Th (n>Th), the packet flow retransmission controlling unit 10 sends a signal requesting retransmission of packet data to the turbo encoding and frame forming unit 11. At this time, the number of discordant sign bits n is compared with another predetermined threshold value Tha, and the contents of the retransmission request is changed in accordance with the comparison result. For example, in case the number of discordant sign bits n is equal to or less than the threshold value Tha (n≦Tha), the packet flow retransmission controlling unit 10 sends a signal requesting retransmission of only data which is deleted at the puncturing processing to the turbo encoding and frame forming unit 11. On the other hand, in case the number of discordant sign bits n is larger than the threshold value Tha (n>Tha), the packet flow retransmission controlling unit 10 sends a signal requesting retransmission of all the packet data (original punctured codes) which is sent previously or all the data before being deleted at the puncturing processing to the turbo encoding and frame forming unit 11.

In case only data which is deleted at the puncturing processing is required to be retransmitted, the deinterleaving and depuncturing unit 16 combines the data which is deleted at the puncturing processing and the previously transmitted packet data (punctured codes) and decodes the combined data as data which is not punctured, thereby improving error correction ability. Thus, generation of error can be suppressed. Generally, the number of bits which are deleted by the puncturing processing is from several % to 20% of all the error-correcting-coded packet data, which is smaller than that of bits of all the packet data. Thus, the efficiency of data transmission can be improved.

On the other hand, in case the number of discordant sign bits n is larger than the threshold value Tha, the number of discordant sign bits n may be compared with another threshold value Thb which is larger than the threshold value Tha (Thb>Tha). In case the number of discordant sign bits n is equal to or less than the threshold value Thb (Tha<n≦Thb), the packet flow retransmission controlling unit 10 may send a signal requesting retransmission of data which is the same data as the previously transmitted packet data (punctured codes). In case the number of discordant sign bits n is larger than the threshold value Thb (n>Thb), the packet flow retransmission controlling unit 10 may send a signal requesting retransmission of all the data which is not punctured.

Then, the packet flow retransmission controlling unit 10 performs switching controlling so as to change the processing of the deinterleaving and depuncturing unit 16 in accordance with the contents of the retransmission request (performs deinterleaving and depuncturing processing in accordance with data to be retransmitted).

Furthermore, there is another embodiment in which, in detecting whether or not there exists error, only the detection result of the CRC recalculating unit 9 is used. And, only in case error is detected by the CRC, a signal requesting retransmission is sent, and the contents of the retransmission request is changed in accordance with the number of discordant sign bits n. In this case, error detection by the CRC cannot be coped with. On the other hand, amount of data to be retransmitted can be adjusted in accordance with the degree of code error. Thus, the efficiency of data transmission can be improved.

Figure 7:
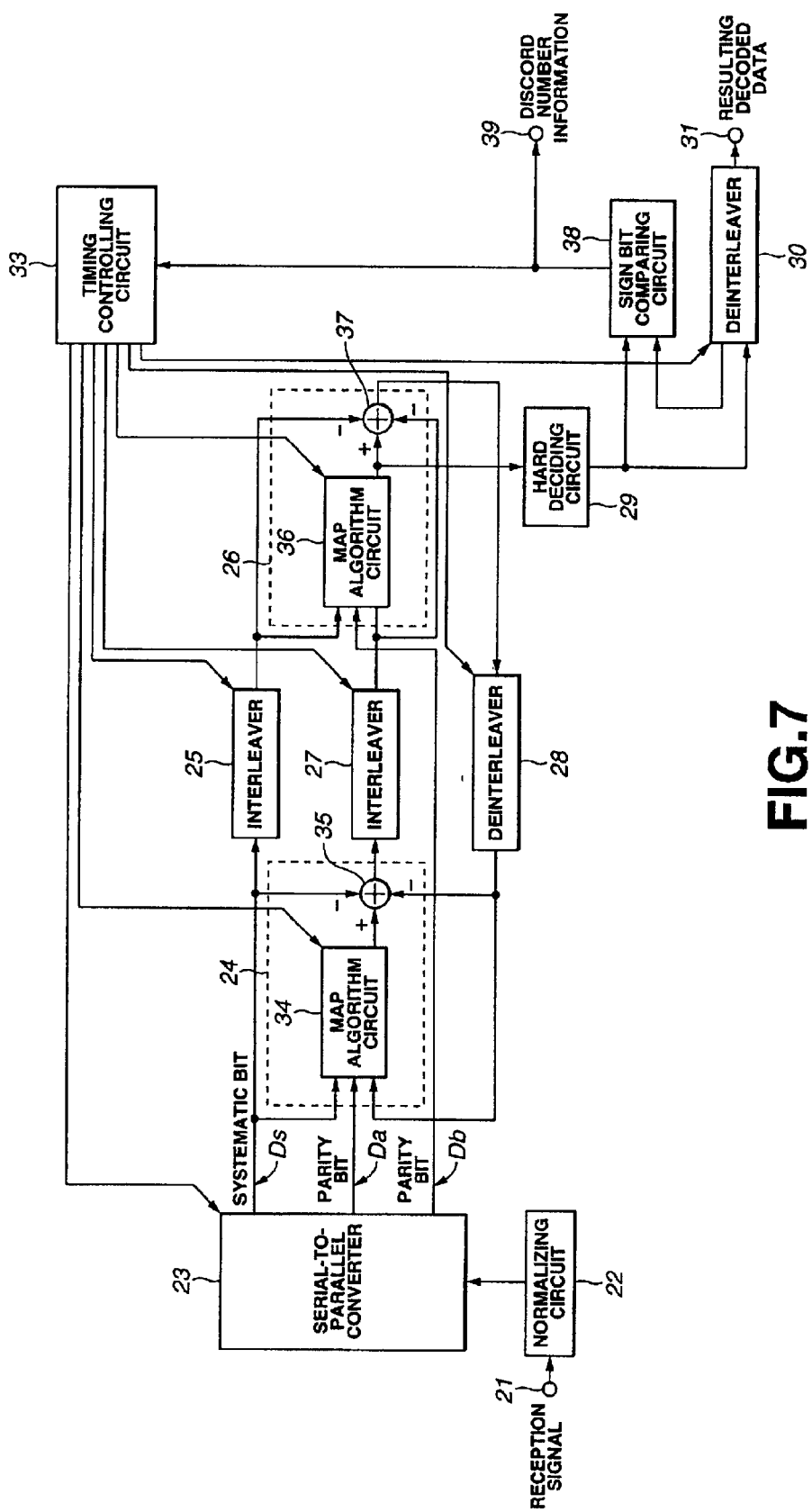
FIG. 7 shows another example of a block diagram of a turbo decoder which is employed in the data transmitting/receiving apparatus according to the present invention.

FIG. 7 shows a block diagram of another example of the turbo decoder 6 which can be used in the data transmitting/receiving apparatus shown in FIG. 4 and FIG. 6.

In the embodiment, a deinterleaver 28 for returning the output from the last stage of the soft output decoding units 24 and 26 of a plurality of stages to the input stage and a deinterleaver 30 for obtaining the resulting decoded data to output the data therefrom are arranged separately. And the output from the MAP algorithm circuit 36 of the soft output decoding unit 26 is sent to the output terminal 31 via the hard deciding circuit 29 and deinterleaver 30, and is output therefrom. Furthermore, decoded data (sign bits) from the hard deciding circuit 29 is also sent to a sign bit comparing circuit 38. The sign bit comparing circuit 38 compares the sign bits of the previous time which are stored in the deinterleaver 30 with the sign bits of the previous time which are from the hard deciding circuit 29, both of which are obtained in the repetitive decoding processing. In case all the sign bits of respective one code blocks are equal to each other, the sign bit comparing circuit 46 sends a signal indicative of the result to the timing controlling circuit 33, and the timing controlling circuit 33 suspends the repeating operation of the repetitive decoding processing. In case all the sign bits of respective one code blocks are not equal to each other, the repeating operation of the repetitive decoding processing is performed predetermined prescribed times, and the ultimate decoded data is sent to the output terminal 31 via the deinterleaver 30 and is output therefrom, while the number of discordant sign bits being output from the output terminal 39 as the discord number information. In FIG. 7, the parts or components similar to those of the turbo decoder shown in FIG. 5 are indicated with the same reference numerals, and the detailed explanation will be omitted. The discord number information from the output terminal 39 is used for judging the existence of ultimate error of the error detection, or for changing the data retransmitting method.

The present invention is not limited to above-described embodiments. The embodiment imposes a condition that all the sign bits of respective one code blocks are equal to each other in suspending the repeating operation of the repetitive decoding processing. On the other hand, the repeating operation of the repetitive decoding processing may be suspended when the number of discordant sign bits becomes very small, for example, equal to or less than a few bits. Furthermore, the configuration of the turbo decode is not limited to that shown in FIG. 5 or FIG. 7. Various modifications can be possible without departing from the scope and spirit of the present invention.

According to the present invention, there is provided a decoding method for decoding parallel concatenated coded data, in performing decoding processing repeatedly using soft output decoding means of a plurality of stages, the decoding method including the steps of comparing data which is decoded this time with data which is decoded previous time both of which are decoded in the repetitive decoding processing, detecting error of resulting decoded data using error detecting codes, and finally judging whether or not error is generated in accordance with error detecting output data obtained at the error-detecting step and comparing output data obtained at the comparing step. Thus, error generated under a certain probability in performing the CRC error detection can be reduced.

According to the present invention, there is also provided a data receiving method which has function of receiving parallel concatenated coded data and decoding the data repeatedly by using soft output decoding means of a plurality of stages, including the steps of comparing data which is decoded this time with data which is decoded previous time both of which are decoded in the repetitive decoding processing, detecting error of resulting decoded data using error detecting codes, and retransmission controlling step of sending a signal requesting retransmission of data in accordance with comparing output data obtained at the comparing step and error detecting output data obtained at the error-detecting step. Thus, amount of data to be retransmitted can be adjusted in accordance with the degree of code error. So, the efficiency of data transmission can be improved.

The comparing step obtains the number of discordant sign bits by comparing sign bits of this time with sign bits of previous time, where the sign bits are included in output data from the last stage of the soft output decoding means of the plural stages. And, in case the number of discordant sign bits is larger than a predetermined value, the judging step determines that there is generated error even though the error detection result shows that there is generated no error, and a signal requesting retransmission of data is sent. Thus, sending incorrect packet data can be avoided.

In case the received coded data is punctured codes which has a portion of data thereof deleted at an encoding side, the retransmission controlling step sends the signal requesting retransmission of data by selecting one of retransmission of the deleted data, retransmission of original punctured codes, and retransmission of all data before being deleted, in accordance with the number of discordant sign bits obtained at the comparing step. Thus, amount of data to be retransmitted can be suppressed. So, the efficiency of data transmission can be improved.

What is claimed is:

1. A decoding apparatus for decoding parallel concatenated coded data comprising:
    soft output decoding means of a plurality of stages for performing decoding processing repeatedly;
    means for comparing data which is decoded this time with data which is decoded previous time, both of which are decoded in the repetitive decoding processing;
    means for detecting error of resulting decoded data using error detecting codes;
    means for finally judging whether or not error is generated in accordance with output data from the error-detecting means and output data from the comparing means;
    wherein the means for comparing data obtains the number of discordant sign bits by comparing sign bits of this time with sign bits of previous time, the sign bits being included in output data from the last stage of the soft output decoding means of the plural stages, and
    wherein if the number of discordant sign bits is larger than a predetermined value, the means for finally judging determines that there was an error generated even though the error detection result shows that no error was generated.

2. A decoding method for decoding parallel concatenated coded data, in performing decoding processing repeatedly using soft output decoding means of a plurality of stages, the decoding method comprising the steps of:
    comparing data which is decoded this time with data which is decoded previous time, both of which are decoded in the repetitive decoding processing;
    detecting error of resulting decoded data using error detecting codes;
    finally judging whether or not error is generated in accordance with error detecting output data obtained at the error-detecting step and comparing output data obtained at the comparing step;
    wherein the comparing step obtains the number of discordant sign bits by comparing sign bits of this time with sign bits of previous time, the sign bits being included in output data from the last stage of the soft output decoding means of the plural stages, and
    in case the number of discordant sign bits is larger than a predetermined value, the judging step determines that there was an error generated even though the error detection result shows that no error was generated.

3. A data receiving apparatus which has soft output decoding means of a plurality of stages for receiving parallel concatenated coded data and decoding the data repeatedly, comprising:
    means for comparing data which is decoded this Lime with data which is decoded previous time, both of which are decoded in the repetitive decoding processing;
    means for detecting error of resulting decoded data using error detecting codes; and
    retransmission controlling means for sending a signal requesting retransmission of data in accordance with output data from the comparing means and output data from the error-detecting means;
    wherein the retransmission controlling means sends the signal requesting retransmission of data in case the error-detecting means determines that there is an error generated, and changes retransmitting manner in accordance with the output data from the comparing means.

4. The data receiving apparatus as set forth in claim 3, wherein
    the comparing means compares sign bits of this time with sign bits of previous time, the sign bits being included in output data from the last stage of the soft output decoding means of the plural stages, and
    the retransmission controlling means sends the signal requesting retransmission of data in case the error-detecting means determines that there is generated error, and changes the retransmitting manner in accordance with the number of discordant sign bits obtained by the comparing means.

5. The data receiving apparatus as set forth in claim 4, wherein the received coded data is punctured codes which has a portion of data thereof deleted at an encoding side, and
    the retransmission controlling means sends the signal requesting retransmission of data by selecting one of retransmission of the deleted data, retransmission of original punctured codes, and retransmission of all data before being deleted, in accordance with the number of discordant sign bits obtained by the comparing means.

6. The data receiving apparatus as set forth in claim 3, wherein the comparing means compares sign bits of this time with sign bits of previous time, the sign bits being included in output data from the last stage of the soft output decoding means of the plural stages, and, in case the number of discordant sign bits is larger than a predetermined value, it is determined that there is generated error irrespective of the error detection result, and the retransmission controlling means sends the signal requesting retransmission of data.

7. The data receiving apparatus as set forth in claim 6, wherein the received coded data is punctured codes which has a portion of data thereof deleted at an encoding side, and the retransmission controlling means sends the signal requesting retransmission of data by selecting one of retransmission of the deleted data, retransmission of original punctured codes, and retransmission of all data before being deleted, in accordance with the number of discordant sign bits obtained by the comparing means.

8. A data receiving method which has function of receiving parallel concatenated coded data and decoding the data repeatedly by using soft output decoding means of a plurality of stages, comprising the steps of:

comparing data which is decoded this time with data which is decoded previous time, both of which are decoded in the repetitive decoding processing;

detecting error of resulting decoded data using error detecting codes; and retransmission controlling step of sending a signal requesting retransmission of data in accordance with comparing output data obtained at the comparing step and error detecting output data obtained at the error-detecting step;

wherein the retransmission controlling step sends the signal requesting retransmission of data in case the error-detecting step determines that there is an error generated, and changes retransmitting manner in accordance with the comparing output data obtained at the comparing step.

9. The data receiving method as set forth in claim 8, wherein the comparing step compares sign bits of this time with sign bits of previous time, the sign bits being included in output data from the last stage of the soft output decoding means of the plural stages, and the retransmission controlling step sends the signal requesting retransmission of data in case the error-detecting step determines that there is generated error, and changes the retransmitting manner in accordance with the number of discordant sign bits obtained at the comparing step.

10. The data receiving method as set forth in claim 9, wherein the received coded data is punctured codes which has a portion of data thereof deleted at an encoding side, and the retransmission controlling step sends the signal requesting retransmission of data by selecting one of retransmission of the deleted data, retransmission of original punctured codes, and retransmission of all data before being deleted, in accordance with the number of discordant sign bits obtained at the comparing step.

11. The data receiving method as set forth in claim 8, wherein the comparing step compares sign bits of this time with sign bits of previous time, the sign bits being included in output data from the last stage of the soft output decoding means of the plural stages, and, in case the number of discordant sign bits is larger than a predetermined value, it is determined that there is generated error irrespective of the error detection result, and the retransmission controlling step sends the signal requesting retransmission of data.

12. The data receiving method as set forth in claim 11, wherein the received coded data is punctured codes which has a portion of data thereof deleted at an encoding side, and the retransmission controlling step sends the signal requesting retransmission of data by selecting one of retransmission of the deleted data, retransmission of original punctured codes, and retransmission of all data before being deleted, in accordance with the number of discordant sign bits obtained at the comparing step.

* * * * *